United States Patent [19]

Yasue

[11] Patent Number: 5,060,043
[45] Date of Patent: Oct. 22, 1991

[54] SEMICONDUCTOR WAFER WITH NOTCHES

[75] Inventor: Takao Yasue, Hyogo, Japan

[73] Assignee: Mitsubishi Denki Kabushiki Kaisha, Tokyo, Japan

[21] Appl. No.: 462,525

[22] Filed: Jan. 9, 1990

[30] Foreign Application Priority Data

Jun. 26, 1989 [JP] Japan .................... 1-163534

[51] Int. Cl.$^5$ ............................................ H01L 27/02
[52] U.S. Cl. ........................................ 357/40; 357/55; 357/60; 437/249
[58] Field of Search ............................ 357/40, 60, 55; 437/249; 148/33, 33.2

[56] References Cited

U.S. PATENT DOCUMENTS 4,783,225 11/1988 Maejima et al. .................... 357/55 X

FOREIGN PATENT DOCUMENTS 60-119709 6/1985 Japan .
63-148614 5/1988 Japan .
63-108706 6/1988 Japan .

Primary Examiner—William Mintel
Assistant Examiner—Roy Potter
Attorney, Agent, or Firm—Lowe, Price, LeBlanc and Becker

[57] ABSTRACT

A semiconductor wafer having a mark indicating a specified crystal orientation is disclosed. In a preferred embodiment, first and second notches are provided on a circular outer periphery of the semiconductor wafer. A line coupling the vertices of the first and second notches indicates the crystal orientation of the semiconductor wafer. By using such notches as marks for identifying the crystal orientation, the loss of useful area of the semiconductor wafer can be reduced. Generation of slip lines which are crystal defects can be suppressed. Such notches can be formed on the bar member before slicing. By providing the notches on the bar member before individual wafers are cut therefrom, it becomes unnecessary to provide notches on the individual semiconductor wafers one by one.

11 Claims, 4 Drawing Sheets

SEMICONDUCTOR WAFER WITH NOTCHES

BACKGROUND OF THE INVENTION

1. Field of the Invention

The present invention relates to a semiconductor wafer and, more specifically, to an improvement of a mark for identifying crystal orientation of a semiconductor wafer provided on the semiconductor wafer for identifying a specific crystal orientation of the semiconductor wafer.

2. Description of the Background Art

An orientation flat serving as a reference for identifying the crystal orientation is provided on a semiconductor wafer. FIG. 6 is a plan view of a semiconductor wafer having the orientation flat. The orientation of a main surface 2 of the semiconductor wafer 1 is (100). One crystal orientation <110> of the semiconductor wafer 1 is in the direction shown by A and in the direction shown by B which is orthogonally intersecting the direction shown by A. An orientation flat 3 is provided on the semiconductor wafer 1 by cutting a portion of an outer periphery of the semiconductor wafer 1 along the direction shown by A. The orientation flat 3 has the following two functions.

First, the orientation flat 3 serves as a reference for alignment in lithography during the manufacturing process of the semiconductor.

Secondly, the orientation flat 3 serves as a reference in dicing the semiconductor wafer into semiconductor chips.

However, provision of the orientation flat on the semiconductor wafer exhibits the following drawbacks. As described above, the orientation flat serves as a reference for alignment. In order to realize precise alignment, the orientation flat must be of some length. Consequently, a large area of the semiconductor wafer is cut away in providing the orientation flat on the semiconductor wafer. Accordingly, the number of semiconductor chips which can be formed on one semiconductor wafer is reduced.

As the orientation flat is provided on the semiconductor wafer, the peripheral portion of the semiconductor wafer comes to be defined by a curve and a line. When the semiconductor wafer having the orientation flat is thermally processed, the outer peripheral portion of the semiconductor wafer does not expand uniformly, thereby causing stress in the semiconductor wafer. Now, when a force is applied to a member having a portion at which the shape of the member is abruptly changed, the stress is concentrated at that portion. As to the semiconductor wafer having the orientation flat, the shape of the semiconductor wafer is abruptly changed at the portion of the orientation flat. Therefore, when the semiconductor wafer is thermally processed, stress is concentrated on the portion having the orientation flat. Consequently, crystal defects are generated at the portion of the orientation flat of the semiconductor wafer. The crystal defects can be seen as slip lines.

FIG. 7 is a plan view of a semiconductor wafer on which slip lines are generated. The orientation of a main surface 5 of a semiconductor wafer 4 is (100). One crystal orientation <110> of the semiconductor wafer 4 is in the direction shown by C and in the direction shown by D which is orthogonal to the direction shown by C. The orientation flat 6 is formed by cutting away a portion of the outer periphery of the semiconductor wafer 4 along the direction of C. Slip lines 7 are generated at the portion of the orientation flat 6 of the semiconductor wafer 4. The slip lines 7 extend in the direction of D. The portion which is discontinued from the curve defining the outer periphery of the semiconductor wafer 4, that is, the portion of the orientation flat 6, must be long to some extent as mentioned above. Therefore, stress is concentrated at a relatively wide range during thermal processing of the semiconductor wafer 4, so that the slip lines 7 are generated in the wide range.

The following two prior art references disclose semiconductor wafers having marks, other than the orientation flat, for identifying the crystal orientation. One is disclosed in Japanese Patent Laying-Open No. 60-119709. In this prior art, a through hole, a semicircular notch or the like is provided on the semiconductor wafer, which is used as a mark for identifying the crystal orientation of the semiconductor wafer.

The specific content will be described in the following. Japanese Patent Laying-Open No. 60-119709 discloses three semiconductor wafers. The first one shown in FIG. 8 has a through hole 9 serving as a mark for identifying the crystal orientation at the center of the semiconductor wafer 8 whose outer periphery is circular. The through hole 9 is an isosceles triangle. A portion at which two sides having the same length intersect with each other is a vertex 10 of the isosceles triangle. A side 11 is facing the vertex 10. A line coupling the side 11 with the vertex 10 seems to identify the crystal orientation of the semiconductor wafer 8.

In the semiconductor wafer 8 shown in FIG. 8, the area of the through hole 9 is made smaller than the area of the wafer which is cut off for providing the orientation flat. Therefore, the consequential loss of the semiconductor wafer 8 can be made smaller than that of the semiconductor wafer having the orientation flat. However, since the distance between the vertex 10 and the side 11 is short, the through hole 9 does not exactly indicate the crystal orientation.

Since the outer periphery of the semiconductor wafer is circular, the outer periphery of the semiconductor wafer 8 expands uniformly when it is thermally processed. Consequently, no stress is generated in the semiconductor wafer 8, and accordingly no slip line is generated in the semiconductor wafer 8.

Another semiconductor wafer disclosed in the Japanese Patent Laying-Open No. 60-119709 is as shown in FIG. 9, which has a through hole and a notch serving as marks for identifying the crystal orientation provided on a semiconductor wafer having circular outer periphery. A circular through hole 13 is provided at the center of the semiconductor wafer 12. A semicircular notch 14 is provided on the outer periphery of the semiconductor wafer 12. A line coupling the through hole 13 and the notch 14 seems to indicate a specific crystal orientation of the semiconductor wafer 12. The loss of the semiconductor wafer 12 is only in the areas at both ends of the line, namely, the portion of the through hole 13 and the notch 14. The through hole 13 and the notch 14 may be small, since they are used only for defining a line serving as a reference for identifying crystal orientation. Compared with the orientation flat, the area loss of the semiconductor wafer can be reduced by these marks for identifying the crystal orientation.

As mentioned above, the notch 14 may be small. Therefore, the outer periphery of the semiconductor wafer 12 is approximately circular, so that the outer portions of the semiconductor wafer 12 are expanded approximately uniformly when it is thermally processed. Accordingly, the stress generated in the semiconductor wafer 12 is small, and therefore slip lines are less frequently generated even if the stress is concentrated at the notch 14.

A further semiconductor wafer disclosed in the Japanese Patent Laying-Open No. 60-119709 is as shown in FIG. 10, which has through holes serving as marks for identifying crystal orientation provided on a semiconductor wafer 15 whose outer periphery is circular. Through holes 16 and 17 are provided near the outer periphery of the semiconductor wafer 15, which through holes 16 ant 17 are both circular. A line coupling the through holes 16 and 17 seems to identify the crystal orientation of the semiconductor wafer 15. The area loss of the semiconductor wafer 15 can be reduced for the same reason as described above with reference to the semiconductor wafer 12 shown in FIG. 9. Slip lines are not generated in the semiconductor wafer 15 for the same reason as described above with reference to the semiconductor wafer 8 shown in FIG. 8.

Another example of prior art relating to a semiconductors wafer, having a mark, other than an orientation flat for identifying the crystal orientation is disclosed in Japanese Patent Laying-Open No. 63-148614. In this reference, a mark for identifying the crystal orientation is provided on a semiconductor wafer in the following manner. First, a main surface of a semiconductor wafer having circular outer periphery is irradiated from above by X-ray. The diffracted X-ray is measured by a detector, whereby the crystal orientation of the semiconductor wafer is detected. A mark indicating the crystal orientation is applied on the surface of the semiconductor wafer. Since a mark indicating the crystal orientation is applied on the surface of the semiconductor wafer, there is no area loss of the semiconductor wafer. The outer periphery of the semiconductor wafer is circular, so that the outer periphery of the semiconductor wafer expands uniformly when it is thermally processed. Therefore, no stress is generated in the semiconductor wafer, and accordingly no slip line is generated in the semiconductor wafer.

Semiconductor wafers are manufactured by slicing a bar semiconductor. Since the bar is considerably long, it is difficult to provide a through hole in the longitudinal direction of the bar. Therefore, in the prior art disclosed in the Japanese Patent Laying-Open No. 60-119709 in which a through hole is provided on a semiconductor wafer as a mark for identifying the crystal orientation, the through hole must be provided on the semiconductor wafer after it is sliced. Provision of a through hole in a number of the semiconductor wafers one by one takes much time, reducing efficiency in the producing of semiconductor devices.

As to the prior art examples disclosed in the Japanese Patent Laying-Open No. 60-119709, the mark for identifying the crystal orientation shown in FIG. 8 does not precisely indicate the crystal orientation of the semiconductor wafer, compared with the orientation flat. The following is also a reason of the lower precision in indicating the crystal orientation of this mark for identifying the crystal orientation. Namely, the mark for identifying the crystal orientation shown in FIG. 8 indicates a specific crystal orientation by a line coupling the side 11 and the vertex 10. However, there are two lines coupling the side 11 and the vertex 10. Consequently, the crystal orientation cannot be uniquely indicated by the mark for identifying the crystal orientation. It is the same in the case of the mark for identifying the crystal orientation shown in FIG. 9. Namely, there can be a number of lines coupling the circular through hole 13 and the semicircular notch 14 because of their finite size, so that the crystal orientation cannot be precisely indicated. It is also the same in the case circular marks of finite size, as shown in FIG. 10.

The prior art disclosed in the Japanese Patent Laying-Open No. 63-148614 provides a mark indicating the crystal orientation on the surface of the semiconductor wafer, as described above. Since such a mark cannot not be applied on the bar member before slicing, the mark must be applied on individual semiconductor wafers produced by slicing the bar. Namely, in this prior art also, marks must be applied on the semiconductor wafer one by one, reducing the efficiency in producing semiconductor devices.

In addition, specific disclosure is not given in the Japanese Patent Laying-Open No. 63-148614 about the mark for identifying the crystal orientation applied on the semiconductor wafer. Whether or not the crystal orientation can be precisely indicated by the mark cannot be determined.

SUMMARY OF THE INVENTION

The present invention was made to solve the above described problems and its object is to provide a semiconductor wafer having a mark for identifying specified crystal orientation which mark can be readily provided to the bar member before slicing, which reduces area loss of the semiconductor wafer and suppresses generation of slip lines.

Another object of the present invention is to provide a semiconductor wafer having a mark which precisely identifies the crystal orientation of the semiconductor wafer.

A further object of the present invention is to provide a method of effectively providing marks for identifying specified crystal orientation of the semiconductor wafer on the semiconductor wafers.

The present invention relates to a semiconductor wafer having a mark for identifying a specified crystal orientation. The semiconductor wafer in accordance with the present invention has a circular outer periphery.

In accordance with a first aspect of the present invention, first and second angular notches, each defined by a pair of intersecting surfaces are provided spaced apart from each other on the outer periphery of the semiconductor wafer. A line coupling the vertices of the first and second notches serves as a reference for identifying a specified crystal orientation.

In accordance with a second aspect of the present invention, a notch serving as a mark for identifying the crystal orientation is provided on the outer periphery of the semiconductor wafer. The notch has its shape defined by two orthogonally intersecting notched surfaces.

In accordance with the first aspect of the present invention, first and second notches are provided spaced apart from each other on the outer periphery of the semiconductor wafer. A line coupling the first and second notches serves as a reference for identifying a specified crystal orientation. The area loss of the semiconductor wafer is only the portions on both ends of the line, namely, the portions of the notches. The notches may be small, since they are only to define a line serving as a reference for identifying the crystal orientation.

Therefore, in accordance with the first aspect of the present invention, the area loss of the semiconductor wafer can be reduced compared with that of the semiconductor wafer having an orientation flat.

As described in the foregoing, the notch may be small. Therefore, the outer periphery of the semiconductor wafer is nearly circular. Consequently, the outer periphery of the semiconductor wafer expands approximately uniformly when it is thermally processed, so that the stress generated in the semiconductor wafer is small. Accordingly, slip lines are less frequently generated even if the stress is concentrated to the notch.

In addition, since the notches are provided on the outer periphery of the semiconductor wafer, they can be provided on the bar member before slicing. By using the notch as the mark for identifying the crystal orientation, the efficiency in producing semiconductor devices can be improved as compared with alternative techniques wherein through holes or a mark on the surface of the semiconductor wafer are used as marks for identifying the crystal orientation.

In accordance with the second aspect of the present invention, a notch serving as a mark for identifying the crystal orientation is provided on the outer periphery of the semiconductor wafer. The notch has its shape defined by two notched surfaces orthogonally intersecting with each other. Line formed by the intersection of the two notched surfaces defining the notch and the main surface of the semiconductor wafer serves as references for identifying the specified crystal orientation.

In order to reduce area loss, the notch cannot be made very large. Therefore, the lines formed by the intersection of the notched surfaces and the main surface of the semiconductor wafer cannot be made very long. Consequently, the precision in alignment for lithography is lower than that of the orientation flat. However, a line (hereinafter referred to as a first reference line) formed by the intersection of one of the notched surfaces and the main surface of the semiconductor wafer encounters in the orthogonal direction a line (hereinafter referred to as a second reference line) formed by the intersection of the other one of the notched surfaces and the main surface of the semiconductor wafer. Therefore, it is convenient in dicing the semiconductor wafer into chips. More specifically, the dicing can be carried out in the following manner. A number of cut lines are provided on the surface of the semiconductor wafer parallel to each other, referring to the first reference line. Thereafter, a number of cut lines are provided parallel to each other on the surface of the semiconductor wafer referring to the second reference line. The semiconductor wafer is separated into chips by applying a bending stress thereto.

As described above, the notch is not very large. Therefore, slip lines are less frequently generated at the notch during thermal processing of the semiconductor wafer, as in the first aspect of the present invention.

Since the mark for identifying the crystal orientation is a notch, it can be provided easily on the bar member before slicing. Therefore, compared with the cases where through holes and marks provided on the surface of the semiconductor wafers are used as the marks for identifying crystal orientation, the efficiency in producing semiconductor devices can be improved. Especially in the second aspect of the present invention, only one notch is provided on the semiconductor wafer, so that the efficiency in producing semiconductor devices can be further improved compared with the first aspect of the present invention.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
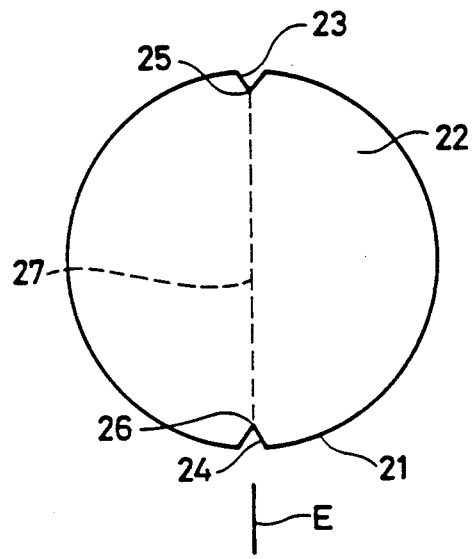
FIG. 1 is a plan view of a first embodiment of the semiconductor wafer in accordance with the present invention.

A first embodiment of the semiconductor wafer in accordance with the present invention will be described with reference to FIG. 1. An outer periphery of a semiconductor wafer 21 is circular. The diameter of the circle is, for example 200 mm. The semiconductor wafer 21 is formed of silicon, with the orientation of the main surface 22 being (100). First and second notches 23 and 24 are provided on the outer periphery of the semiconductor wafer 21. The first and the second notches 23 and 24 are both V shaped. The vertex of the V shape of the first notch 23 is 25. The vertex of the V shape of the second notch 24 is 26. A line 27 coupling the vertices 25 and 26 is on the diameter of the circle defining the outer periphery of the semiconductor wafer 21. Therefore, the line 27 coupling the vertices 25 and 26 has approximately the same length as the diameter of the circle defining then outer periphery of the semiconductor wafer 21. The line 27 coupling the vertices 25 and 26 indicates one crystal orientation <110> of the semiconductor wafer 21, represented by E. The line 27 is an imaginary line. The line 27 is not directly drawn on the semiconductor wafer 21. How to form the first and the second notches 23 and 24 serving as marks for identifying the orientation <110> on the semiconductor wafer 21 will be described in the following with reference to FIGS. 5A to 5D.

Figure 5A:
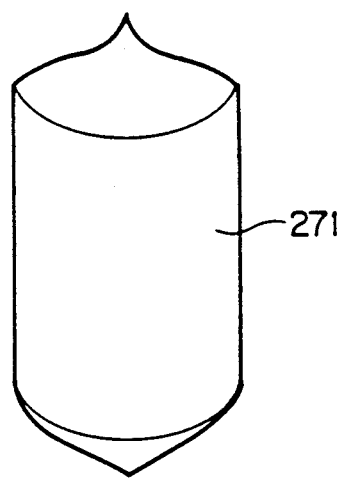
FIGS. 5A to 5D show, in this order, a method of manufacturing the semiconductor wafer in accordance with the present invention.

First, referring to FIG. 5A, a single crystal silicon bar 27 is prepared. The single crystal silicon bar 27 has its outer surface polished.

Figure 5B:
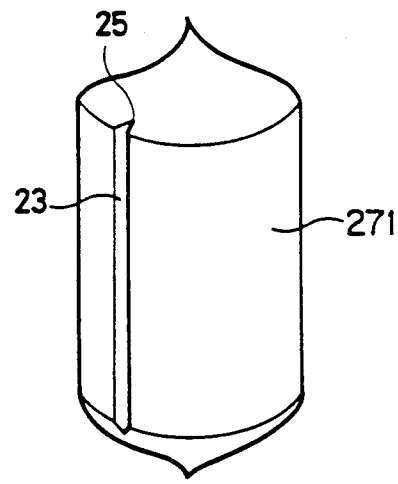

Thereafter, referring to FIG. 5B, the single crystal silicon bar 271 is irradiated by X-ray, and the crystal orientation <110> is detected by the X-ray diffraction. The first notch 23 and the second notch 24 are provided on the outer periphery of the single crystal silicon bar 271 such that the line coupling the vertex 25 of the first notch 23 and the vertex 26 of the second notch 24 indicates the crystal orientation <110>. The first and second notches 23 and 24 are provided along a generating line of the single crystal silicon bar. The second notch 24 is not shown in FIG. 5B.

Figure 5C:
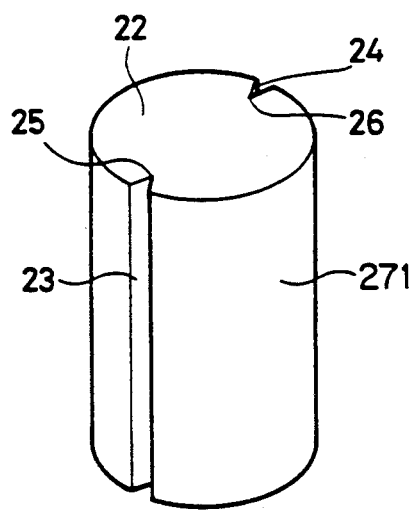

Thereafter, referring to FIG. 5C, both ends of the single crystal silicon bar 271 are cut. The surface 22 having the orientation of (100) is exposed.

Figure 5D:
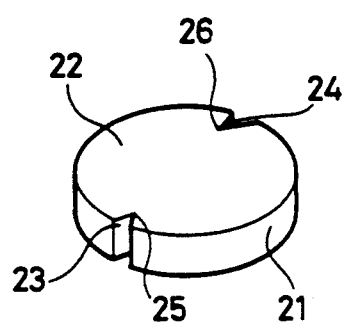

Then, referring to FIG. 5D, the single crystal silicon bar 271 is sliced to provide semiconductor wafers 21. By the above described process, a semiconductor wafer 21 having first and second notches 23 and 24 serving as marks for identifying the crystal orientation <110> is manufactured.

Particular effects of this embodiment will be described in the following. As shown in FIG. 1, the first and second notches 23 and 24 are V shaped, so that the vertices 25 and 26 are defined unequivocally. Accordingly, the line 27 coupling the bottom portions 25 and 26 indicating the crystal orientation of the semiconductor wafer 21 is defined uniquely. Consequently, in accordance with this embodiment, the crystal orientation of the semiconductor wafer 21 can be indicated exactly.

In this embodiment, the line 27 coupling the vertices 25 and 26 indicates the specified crystal orientation of the semiconductor wafer 21. Compared with a case in which notches are provided such that a line coupling the both bottom portions intersect, by a predetermined angle, with the specified crystal orientation of the semiconductor wafer, alignment in lithography is facilitated.

The line 27 coupling the vertices 25 and 26 has approximately the same length as the diameter of the circle defining the outer periphery of the semiconductor wafer 21 in this embodiment. It is longer than a common orientation flat. Therefore, alignment for lithography can be carried out more precisely.

When a semiconductor wafer having an orientation flat is thermally processed, the semiconductor wafer may possibly be warped, since the outer periphery of the semiconductor wafer does not expand uniformly. The warp of the wafer cannot be neglected when the diameter of the circle defining the outer periphery of the semiconductor wafer is or larger 200 mm. However, in the present embodiment, the outer periphery of the semiconductor wafer is approximately circular, so that the outer periphery of the wafer expands uniformly during thermal processing. Therefore, even when the diameter of the circle defining the outer periphery of the semiconductor wafer is large, the problem of the warp is not very serious.

Although the first and the second notches 23 and 24 are provided such that the line 27 coupling the vertices 25 and 26 approximately corresponds to a diameter of the circle defining the outer periphery of the semiconductor wafer 21 in the foregoing, locations for the notches are not limited thereto, and notches may be provided such that the line coupling the bottom portions is not on the diameter of the circle defining the outer periphery of the semiconductor wafer.

Since the first and the second notches 23 and 24 are to specify both ends of the line 27 serving as a reference for identifying the specified crystal orientation, 1 mm may be enough as the depth of the first and second notches.

Figure 2:
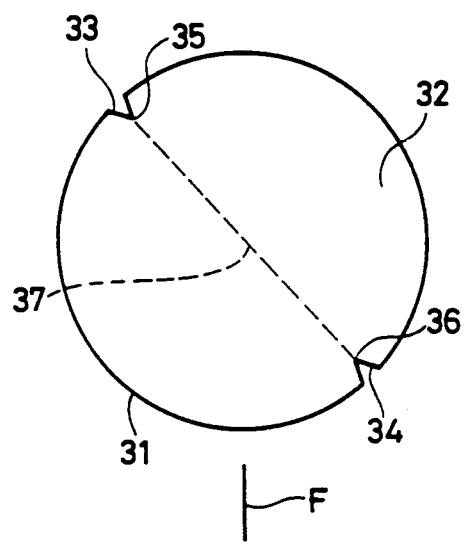
FIG. 2 is a plan view of a second embodiment of the semiconductor wafer in accordance with the present invention.

A second embodiment of the semiconductor wafer in accordance with the present invention will be described in the following with reference to FIG. 2. A semiconductor wafer 31 has a circular outer periphery, and the semiconductor wafer 31 is formed of silicon with the orientation of the main surface 32 being (100). First and second notches 33 and 34 are provided on the outer periphery of the semiconductor wafer 31. The first and second notches 33 and 34 are both V shaped. The vertex of the V shape of the first notch 33 is 35. The vertex of the V shape of the second notch 34 is 36. A line coupling the vertices 35 and 36 is on the diameter of the circle defining the outer periphery of the semiconductor wafer 31. Consequently, the line 37 coupling the verticles 35 and 36 has approximately the same length as the diameter of the circle defining the outer periphery of the semiconductor wafer 31. The first and the second notches 33 and 34 are provided such that the line 37 coupling the vertices 35 and 36 intersect, a crystal orientation <100> of the semiconductor wafer 31 shown by F by a prescribed angle. This is the only difference between the second embodiment and the first embodiment. The line 37 is an imaginary line and is not directly drawn on the semiconductor wafer 31.

When the notches are provided at such positions, the generation of the slip lines can be suppressed compared with the semiconductor wafer having an orientation flat, even if the stress is concentrated to the notch during thermal processing of the semiconductor wafer.

Figure 3:
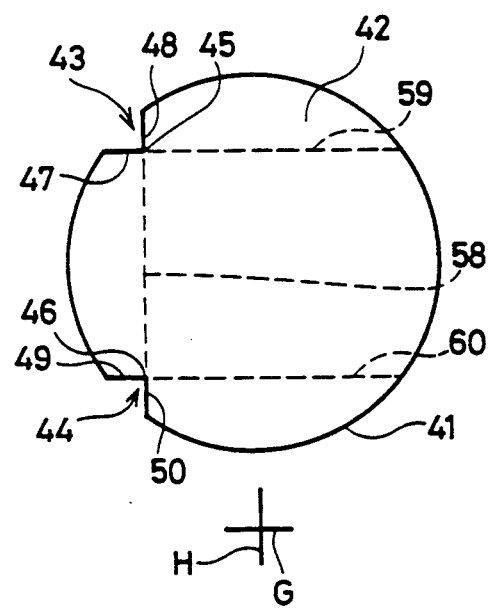
FIG. 3 is a plan view of a third embodiment of the semiconductor wafer in accordance with the present invention.
Figure 4:
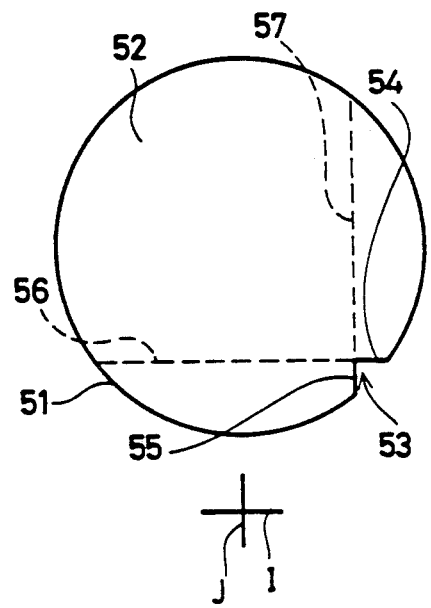
FIG. 4 is a plan view of a fourth embodiment of the semiconductor wafer in accordance with the present invention.

A third embodiment of the semiconductor wafer in accordance with the present invention will be described in the following with reference to FIG. 3. The semiconductor wafer 41 has a circular outer periphery. The orientation of the main surface 42 is (100). First and second notches 43 and 44 are provided on the outer periphery of the semiconductor wafer 41. The first notch 43 is defined by a notched surface 47 and a notched surface 48. The notched surfaces 47 and 48 abut each other orthogonally. The orthogonal intersecting point is the vertex 45. The second notch 44 is defined by notched surfaces 49 and 50. The notched surfaces 49 and 50 abut each other orthogonally. The orthogonal intersecting point is the vertex 46.

A line 58 coupling the vertices 45 and 46 indicates one crystal orientation <110> of the semiconductor wafer 41 shown by H. The notched surfaces 48 and 50 are on the same plane. A line formed by the intersection of the notched surfaces 48 and 50 with the main surface 42 of the semiconductor wafer 41 also indicates one crystal orientation <110> of the semiconductor wafer 41 shown by H.

The line 59 which is an extension of the line formed by the intersection of the notched surface 47 and the main surface 42 shows one crystal orientation <110> of the semiconductor wafer 41 shown by G. The line 60 which is an extension of a line formed by the intersection of the notched surface 49 with the main surface 42 also shows one crystal orientation <110> of the semiconductor wafer 41 shown by G.

Figure 6:
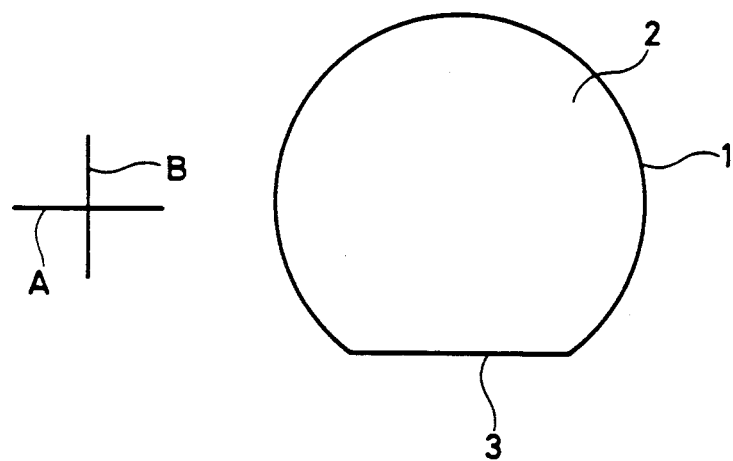
FIG. 6 is a plan view of a conventional semiconductor wafer having an orientation flat serving as a mark for identifying crystal orientation.
Figure 7:
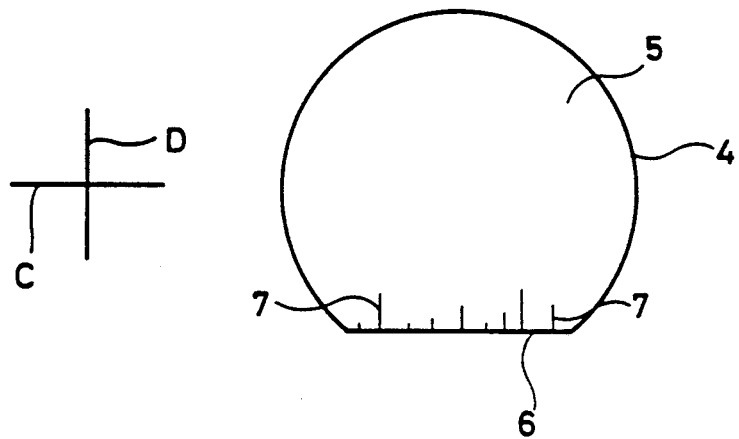
FIG. 7 shows slip lines generated on the portion of the orientation flat.
Figure 8:
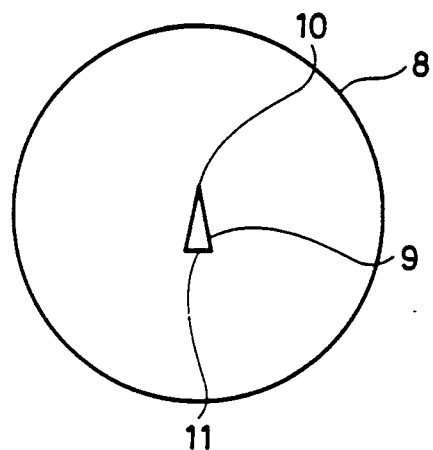
FIGS. 8 to 10 are plan views of conventional semiconductor wafers having through holes and the like serving as marks for identifying crystal orientation.
Figure 9:
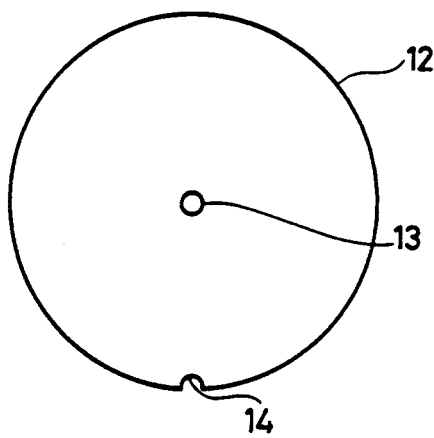
Figure 10:
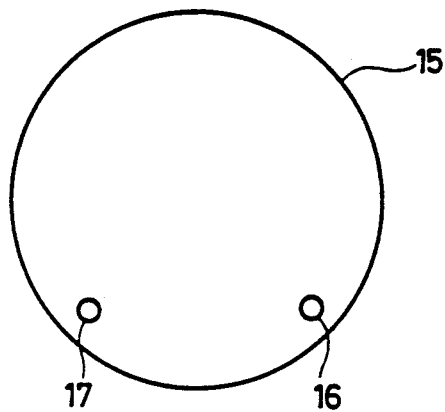

A particular effects of the present embodiment will be described in the following. As shown in FIG. 6, in case of a semiconductor wafer 1 having the orientation flat 3, the identification of the crystal orientation <110> shown by B is realized by searching an orthogonal direction to the orientation flat 3. In third embodiment of the present invention, the line 58 indicates the crystal orientation <110> as shown in FIG. 3, while lines 59 and 60 indicate the crystal orientation <110> shown by G. The lines 58, 59 and 60 are imaginary lines and not actually drawn on the semiconductor wafers 41.

A fourth embodiment of the semiconductor wafer in accordance with the present invention will be described in the following. The semiconductor wafer 51 has a circular outer periphery. The semiconductor wafer 51 is formed of silicon with the orientation of the main surface 52 being (100). A notch 53 is provided on the outer periphery of the wafer 51. The notch 53 is defined by a first notched surface 54 and a second notched surface 55. The first notched surface 54 and the second notched surface 55 abut orthogonally each other. The line 56 which is an extension of a line formed by the intersection of the first notched surface 54 and the main surface 52 indicates on crystal orientation <110> of the semiconductor wafer 51 shown by I. The line 57 which is an extension of a line formed by the intersection of the second notched surface 55 and the main surface 52 indicates one crystal orientation <110> of the semiconductor wafer 51 shown by J. The lines 56 and 57 are imaginary lines and not actually drawn on the semiconductor wafer 51.

In this embodiment, the crystal orientation <110> shown by I and the crystal orientation <110> shown by J can be identified by one notch. Therefore, the semiconductor wafer 51 is diced into chips by the following method. First, a number of cut lines are provided in parallel to each other on the surface of the semiconductor wafer 51 along the line 56. Thereafter, a number of cut lines are provided in parallel to each other on the surface of the semiconductor wafer 51 along the line 57. A bending stress is applied to the semiconductor wafer 51 so that the wafer is divided into chips.

In this embodiment, the line 56 indicates the crystal orientation <110> represented by I while the line 57 indicates the crystal orientation <110> represented by J. However, the present invention is not limited to this embodiment and the notches may be provided such that the line 56 intersects the crystal orientation <110> represented by I by a prescribed angle, and the line 57 intersects the crystal orientation <110> represented by J by a prescribed angle.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor wafer having a reference for identifying a specified crystal orientation, comprising:
   a circular periphery; and
   first and second notches spaced apart from each other on the outer periphery of said semiconductor wafer,
   wherein each of said first and second notches has an angular V-shape with a vertex, and a line coupling the vertices of said first and second notches serves as a reference for identifying the specified crystal orientation.

2. A semiconductor wafer according to claim 1, wherein:
   the line coupling the vertices of said first and second notches is on a diameter of a circle defining the outer periphery of said semiconductor wafer.

3. A semiconductor wafer according to claim 1, wherein:
   the line coupling said first and second notches indicates a specified crystal orientation of said semiconductor wafer.

4. A semiconductor wafer according to claim 1, wherein:
   the line coupling the vertices of said first and second notches intersects a specified crystal orientation of said semiconductor wafer by a prescribed angle.

5. A semiconductor wafer according to claim 1, wherein:
   each of said first and second notches is defined by a pair of intersecting surfaces that abut orthogonally with each other.

6. A semiconductor wafer according to claim 5, wherein:
   one of the surfaces defining said first notch and one of the surfaces defining said second notch are in a common plane.

7. A semiconductor wafer according to claim 6, wherein:
   a line formed by a intersection of the surfaces on said common plane with a main surface of said semiconductor wafer indicates a specified crystal orientation, and a line formed by an intersection of one of the orthogonally abutting surfaces with the main surface of said semiconductor wafer further indicates said specified crystal orientation.

8. A semiconductor wafer according to claim 1, wherein:
   the diameter of the circle defining the outer periphery of said semiconductor wafer is not less than 200 mm.

9. A semiconductor wafer having a mark for identifying a specified crystal orientation, comprising:
   a circular outer periphery; and
   a notch serving as a mark formed on the outer periphery of said semiconductor wafer; wherein
   said notch has a shape defined by two orthogonally intersecting surfaces.

10. A semiconductor wafer according to claim 9, wherein:
    lines formed by an intersection of each of the two surfaces defining said notch with a main surface of said semiconductor wafer indicate a specified crystal orientation.

11. A semiconductor wafer according to claim 9, wherein:
    the diameter of the circle defining the outer periphery of said semiconductor wafer is not less than 200 nm.

* * * * *